United States Patent [19]

Bähr et al.

[11] Patent Number: 5,688,388
[45] Date of Patent: Nov. 18, 1997

[54] APPARATUS FOR COATING A SUBSTRATE

[75] Inventors: Martin Bähr, Hasselroth; Günter Bräuer, Freigericht; Erwin Winter, Hanau, all of Germany

[73] Assignee: Balzers und Leybold Deutschland Holding AG, Hanau, Germany

[21] Appl. No.: 681,871

[22] Filed: Jul. 29, 1996

[30] Foreign Application Priority Data

Aug. 17, 1995 [DE] Germany ............... 195 30 259.1
Mar. 2, 1996 [DE] Germany ............... 196 08 073.8

[51] Int. Cl.$^6$ ............................................. C23C 14/35
[52] U.S. Cl. ............... 204/298.22; 204/298.21; 204/298.19; 204/298.16; 204/298.17; 204/298.18; 204/298.09; 204/298.26; 204/298.28; 204/298.12
[58] Field of Search ................. 204/298.09, 298.16, 204/298.17, 298.18, 298.19, 298.21, 298.22, 298.23, 298.26, 298.28, 298.12

[56] References Cited

U.S. PATENT DOCUMENTS

| | | | |
|---|---|---|---|
| 3,616,402 | 10/1971 | Kuagai | 204/298.12 |
| 4,166,018 | 8/1979 | Chapin | 204/192 R |
| 4,356,073 | 10/1982 | McKelvey | 204/192 R |
| 4,957,605 | 9/1990 | Hurwitt et al. | 204/298.19 |
| 5,158,660 | 10/1992 | Devigne et al. | 204/298.22 |

FOREIGN PATENT DOCUMENTS

| | | |
|---|---|---|
| 0070899 | of 1983 | European Pat. Off. . |
| 123952 | 1/1977 | Germany . |
| 2707144 | 8/1977 | Germany . |
| 2729286 | 1/1978 | Germany . |
| 217964 | 10/1981 | Germany . |

Primary Examiner—R. Bruce Breneman
Assistant Examiner—Rodney G. McDonald
Attorney, Agent, or Firm—Felfe & Lynch

[57] ABSTRACT

Pole shoes (3, 4, 5) of magnetically conductive material are provided inside of a first tubular target (2). Outside the target (2), a magnetic flux guide element (7) is provided, which has three pole shoes (8, 9, 10) directed toward the hollow body (1), which are connected to each other by magnets (12, 13). These magnets (12, 13) transmit the magnetic field through the target (2) to the pole shoes (3, 4, 5) inside the target (2) across narrow gaps (6, 11).

16 Claims, 4 Drawing Sheets

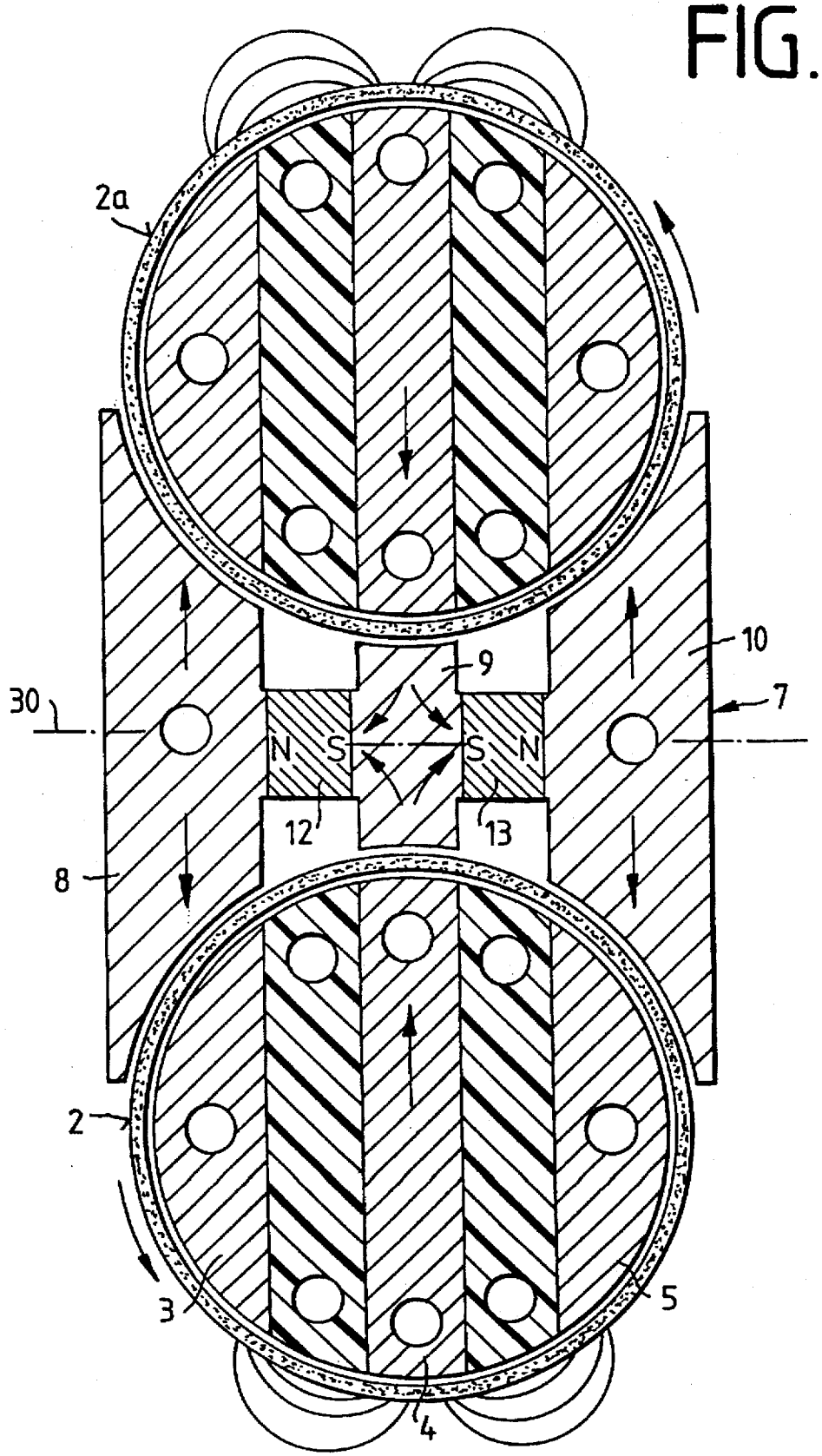

APPARATUS FOR COATING A SUBSTRATE

BACKGROUND OF THE INVENTION

The invention pertains to an apparatus for coating a substrate by sputtering the surface of a rotating, tubular target by means of electrical energy, in which the target is provided with magnets to generate a sputtering zone extending in the longitudinal direction of the target. At least one magnet is associated with pole shoes of magnetically conductive material inside the target so that the magnetic field can be conducted from the magnets to the sputtering zone of the target.

Apparatus of this type are known in the technical field in question and are described in, for example, EP-B-O 070 899, to which U.S. Pat. No. 4,356,073 corresponds. The cylindrical target is usually mounted in rotatable fashion so that fresh target material can be moved into the sputtering zone and thus larger amounts of target material can be sputtered or also so that it is possible to change quickly from one target material to another.

In known apparatus, the magnets are designed as permanent magnets and are installed exclusively in the interior of the target. Because a coolant must flow through the target to carry away the heat generated during sputtering, however, it is necessary to prevent the material of the magnets, which is less resistant to corrosion, from coming in contact with the coolant, usually water. In the apparatus according to EP-B-O 070 899, this is accomplished by arranging the magnets and the pole shoes in a hollow cylinder coaxial to the target, the diameter of this cylinder being smaller than the inside diameter of the target. As a result, a ring-shaped intermediate space is formed, through which the coolant is circulated. In this way, the magnets are completely protected against corrosion, because the coolant cannot touch them. The hollow cylinder also prevents the magnets from being damaged or even destroyed when the target is replaced and also prevents excessive heat from passing from the target into the magnets, which could irreversibly lose their magnetism as a result. The disadvantage here, however, is that the ring-shaped intermediate space increases the distance between the pole shoes and the wall of the target-carrying hollow body, which has the effect of significantly reducing the magnetic field strength which can act on the surface of the target.

To avoid the disadvantage of insufficient field strength, the magnets are usually set up so that the pole shoes are directly in front of the inside lateral surface of the target, and the coolant is allowed to flow through the entire hollow body. The surfaces of the magnets are plated with nickel to protect them from corrosion. This has the disadvantage, however, that extreme caution must be exercised when the target is replaced. If, during the replacement of the target, the nickel-plated surface of the magnet is locally damaged by collision with the target, the magnetic material will very quickly suffer from-subsurface corrosion under the action of the coolant during the operation of the device, and thus the magnets will be destroyed. If the nickel layer has any defects from the very beginning, such damage can occur even if the magnets are not damaged mechanically by the target.

U.S. Pat. No. 4,166,018 discloses a cathode sputtering device capable of a high sputtering rate. A cathode has the material to be sputtered and deposited onto a substrate on one of its surfaces, and a magnetic device installed in such a way that magnetic field lines extending from the sputtering surface and leading back to it again create a discharge area having the form of a closed loop. An anode is located outside the paths of the sputtered material moving from the sputtering surface to the substrate. The cathode surface to be sputtered, i.e., the surface facing the substrate to be coated, is flat; the substrate can be moved parallel to and across the flat sputtering surface in the discharge area; and the magnetic device generating the magnetic field is provided on the side of the cathode facing away from the flat sputtering surface.

A cathode assembly for a sputtering apparatus is also described in DE 27 29 286. This assembly comprises a tubular cathode, the surface of which holds the material to be sputtered in the form of a target, and a magnetic device to generate one or more magnetic fields, by means of which at least one electron trap for the surface of the cathode is defined. This position of this electron trap can be shifted by moving the magnetic device along the surface of the cathode.

In this cathode design as well, it is possible to move the tubular casing relative to the magnetic device in such a way that the material of the cathode can be consumed in a very uniform and effective manner. It is also possible for different types of materials to be sputtered. The substrate is set up, furthermore, in a plane which is parallel to the longitudinal axis of the tubular casing.

DD 123,952 discloses an apparatus for implementing processes of vacuum technology in magnetic field-intensified electrical discharges, including a magnetic field-generating device, a target at negative potential, and an anode. An electrical discharge burns between the target and the anode. The pole shoes of the magnetic field-generating device are designed to form a ring, which is concentric to the cathode, and, depending on the type of vacuum process to be carried out, the device is set up either inside the tubular target or around it on the outside. The magnetic device generates inhomogeneous, toroidal magnetic fields limited in the axial direction, the main field direction of these fields in the area of the target being parallel to the axial direction of the target. When the magnetic field-generating device is installed inside the target, the anode surrounds the target in tubular fashion; and, when the device is installed around the target, the anode is installed inside the target either in the form of a tube or as a piece of solid material. The magnetic field-generating device, the tubular target, and the anode are all capable of movement relative to each other.

DD 217,964 discloses an apparatus for rapid sputtering according to the plasmatron principle, including a magnetic field-generating device with a ring-shaped gap; a cooled, tubular target; and an anode. The magnetic field-generating device has an elongated, ring-shaped gap, closed in itself, and the device is installed inside the target in such a way that its major axis is parallel to the axis of the target. An anode surrounds the target in such a way that the ring-shaped gap area remains free. The distance between the anode and the target surface can be set to a fixed value by an adjusting device, and a drive is provided to generate relative motion around the major axis between the target and the magnetic field-generating device. A device for adjusting the distance between the magnetic field-generating device and the target is also provided on the magnetic field-generating device.

U.S. Pat. No. 5,158,660 discloses a cathode for vacuum sputtering, including a hollow body in the form of a rotationally symmetric element, which can rotate around its axis, with a side wall, which extends along the axis, and with two end surfaces essentially perpendicular to the axis. At least the exterior of the side wall of the hollow body consists of the material to be sputtered. The apparatus also includes a ring of magnets for magnetic confinement near the target, poles, parts of magnetically permeable metal, and magnetizing means, which are suitable for generating a magnetic flux in the ring of magnets. A device is provided to connect the hollow body to a coolant circuit so that a coolant can circulate through the hollow body; a device is provided for establishing a connection to an electric power circuit; and a drive device is provided to rotate the hollow body around its axis. The ring of magnets extends around the circumference of the hollow body; the magnetizing means is provided outside that; and the poles of the ring of magnets are lined up along two generating lines of the hollow body. An arc of the side wall of the hollow body located between these two generatrices forms the target of the cathode.

Finally, DE 27 07 144 discloses a cathode with a surface to be sputtered and a magnetic device near the cathode, opposite the surface to be sputtered, for generating magnetic lines of force. At least some of the lines of force enter the surface to be sputtered and emerge from it again, namely, at intersections spaced a certain distance apart, between which the lines of force form continuous, arc-shaped segments a certain distance away from the surface to be sputtered. This surface, together with the lines of force, form the boundaries of a closed area, with the result that a tunnel-like region is formed, located above a path thus defined on the surface to be sputtered. The charged particles have the tendency to remain inside this tunnel-like region and to move along it. The device also has an anode, set up near the cathode, and connections for the cathode and the anode to a source of electrical potential. At least the surface to be sputtered is situated inside an evacuatable container. Means are also provided for producing relative motion in a specified direction between the magnetic field and the surface to be sputtered while preserving their spatial proximity. The path described above thus passes over the surface to be sputtered and covers a surface region which is larger than the surface region occupied by the path at rest.

In this cylindrical cathode sputtering apparatus, the magnetic device is attached to a cylindrical support and can be not only rotated but also moved up and down, so that it can induce sputtering over the entire surface. It also possible, however, to select only certain areas for sputtering.

SUMMARY OF THE INVENTION

The object of the invention is to protect the magnet or magnets from being corroded by the coolant, while at the same time protecting the magnet or magnets from becoming overheated by the heat given off from the target.

In accordance with the invention the magnet is set up outside the target, and in that the magnetic field is transmitted through the target to the pole shoes inside the target across narrow gaps.

Because the magnet or system of magnets is set up externally, it is impossible for the magnet or system of magnets to suffer mechanical damage when the target is replaced. In addition, there is no longer any need for complicated measures to protect the magnet from corrosion, because the magnet cannot come in contact with the coolant in the target. Narrow gaps can be provided between the target and the pole shoes and between the target and the magnet, which minimizes the loss of magnetic flux. These losses can also be compensated by using one or more magnets of a size larger than that which can be used with an internal arrangement. In contrast to the state of the art, this is now entirely possible because of the availability of ample room outside the target.

Thanks to the invention, it is possible to achieve a high degree of target utilization, which is characterized by only a small degree of edge coating during the reactive process. The apparatus according to the invention operates with great reliability and makes possible an extremely stable coating process without arcing.

In a preferred embodiment, a magnetic flux guide is provided on one side of the target, in alignment with the pole shoes inside the target. This guide element is connected to the magnet. As a result of this design, the magnet or magnets can be mounted relatively far away from the target, so that they are exposed to only very little process heat. This makes it possible to operate with higher target temperatures, which is advantageous for many materials to be sputtered. Higher temperatures also make it possible for the substrate to be heated up by the target, to the extent that this is necessary or advantageous for the coating process in question.

When the magnetic flux guide has three parallel pole shoes directed toward the lateral surface of the target and when a magnet is located on both sides of the center pole shoe, the sputtering zone which forms on the target is approximately rectangular. The poles of the magnets resting against the center pole shoe are the same as each other, and the opposite poles rest against the external pole shoes. As a result, the magnetic flux bulges out like a roof in the area of the target to be eroded, and a closed plasma ring is formed.

In the case of a magnetic flux guide with three parallel pole shoes directed toward the lateral surface of the hollow body, where the central pole shoe rests against one pole of a magnet or is itself formed by the magnet, it is also possible as an alternative for the magnet to be connected by its other pole to a shank of magnetically conductive material which connects the two outer pole shoes together.

The magnet or magnets can be permanent magnets as normally found in comparable apparatus. As a result of the external arrangement of the magnets according to the invention, it is also entirely possible for the magnet or magnets to be electromagnets, because there is no need to feed electrical wiring into the target, which would require a great deal of complicated structural work, especially in the case of a rotatable target.

According to another embodiment of the invention, the pole shoes inside the target are connected to each other by two spacers of magnetically nonconductive but thermally conductive material to form a cylindrical column, so that the pole shoes inside the target can be combined into a block to form a single component.

It is extremely easy to cool the target by providing cooling channels in the pole shoes and/or in the spacers, through which channels a coolant can flow to carry away the heat of the target.

Two cathodes are often set up next to each other in cathode sputtering systems to achieve a higher sputtering rate. In the apparatus according to the invention, this can be done with only a single magnet system by providing a central shank and at least one magnet to connect the three parallel pole shoes of the magnetic flux guide element to each other and by providing a target on each of the two opposite sides of the pole shoes, the pole shoes inside the targets being in alignment with the pole shoes of the magnetic flux guide element. Very high sputtering rates can be obtained by connecting the two targets in alternation to voltage of opposite polarity.

The target, as in the case of comparable devices, can be connected either to the negative potential of a direct-voltage source or to a pulsed voltage or a high frequency.

BRIEF DESCRIPTION OF THE DRAWING

FIG. 5 is a cross section through a third embodiment.

DETAILED DESCRIPTION OF THE PREFERRED EMBODIMENTS

Figure 1:
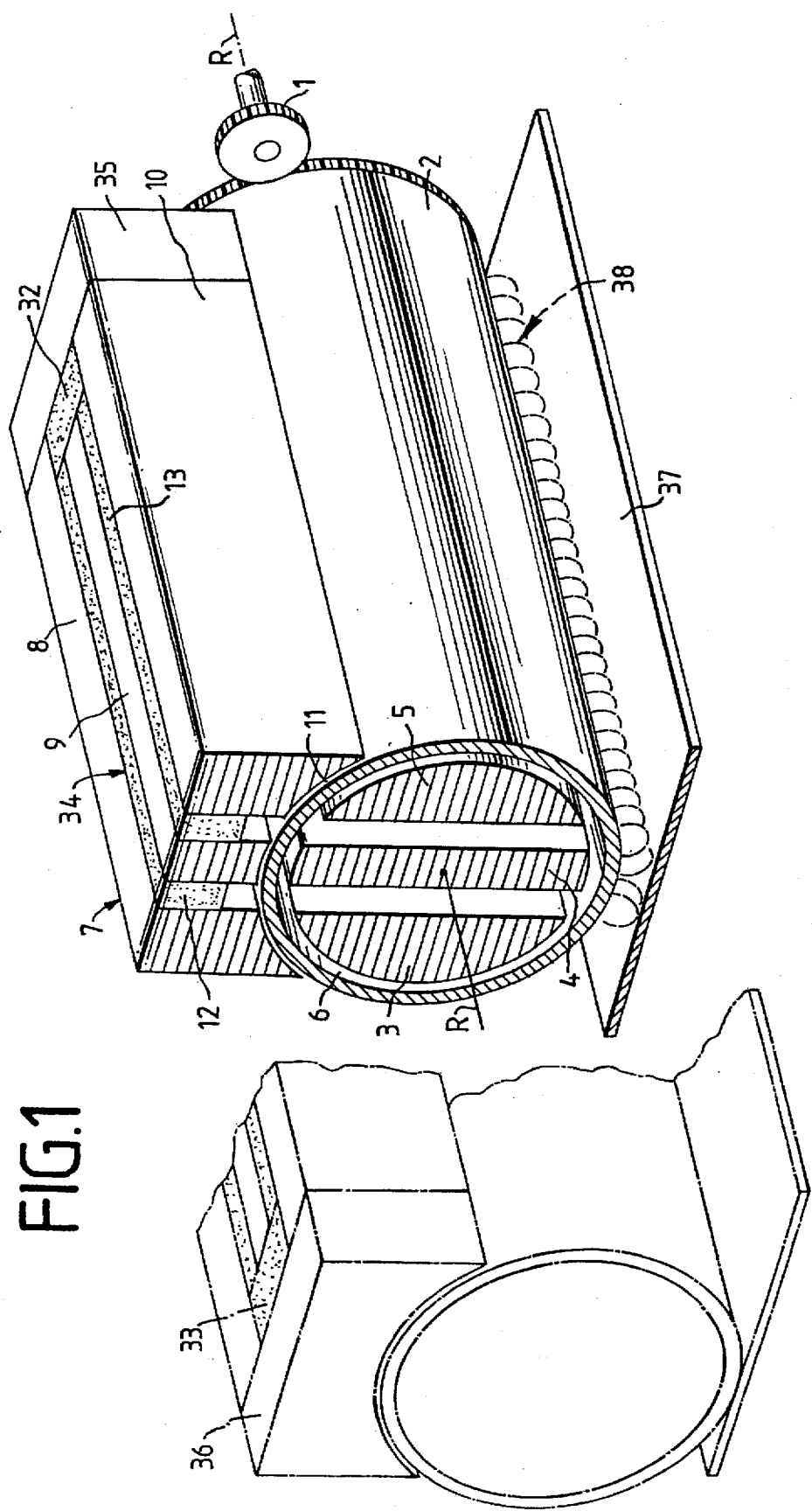
FIG. 1 is a perspective cross-section of an apparatus according to the invention.

FIG. 1 shows a target 2, which is driven by a pinion 1 and is designed as a hollow cylindrical body rotatable around a target axis R. Inside target 2, three pole shoes 3, 4, 5 of magnetically conductive material are arranged in such a way that a gap 6, remains between them and the inside lateral surface of the target.

Outside hollow body 1, a magnetic flux guide element 7 is provided, which has three parallel pole shoes 8, 9, 10, directed toward hollow body 1. These shoes extend up close to the surface of target 2 leaving a gap 11. Magnets 12, 13 are located between pole shoes 8, 9, 10. Magnets 12, 13, together with transverse magnets 32, 33 connecting the end surfaces of magnets 12, 13, form a magnetic frame 34, which is enclosed by pole shoes 8, 10 and two transverse pole shoes 35, 36.

A flat substrate 37 to be coated is set up facing target 2. A closed magnetic tunnel 38 forming an elongated oval extends out toward this substrate.

As a result of the four magnets 12, 13, 32, 33 or rows of magnets which are arranged above the rotating, tubular target, these magnets forming a narrow, rectangular magnetic frame 34 and being themselves completely enclosed or framed by pole shoes 8, 10, 35, 36, and as a result of the corresponding, frame-like configuration of pole shoes 3, 4, 5 located inside target 2, a magnetic tunnel 38 is formed between substrate 37 and target 2. Because target 2 rotates during the sputtering process, however, a sputter pit corresponding to the tunnel is not eroded from the surface of the target.

So that closed magnetic tunnel 38 in the form of an elongated oval can be created, it is clear that all of the pole shoes 8, 9, 10; 3, 4, 5 extending in the longitudinal direction must be connected by pole shoes 35, 36 extending transversely to axis R of target rotation. It is also clear that an expensive bearing is required on the wall of the coating chamber to stabilize and support rotating, motor-driven target 2.

The sectional view according in FIG. 2 again shows magnetic flux guide element 7 with pole shoes 8, 9, 10. Magnets 12, 13 rest with the same pole 14, 15—for example, S—against pole shoe 9 and with their opposite pole 16, 17—in this case, therefore, N—against pole shoes 8, 10. As a result, there is a magnetic flux through pole shoes 8, 9, 10 to pole shoes 3, 4, 5. On the side of target 2 facing away from magnets 12, 13, field lines 18, 19 are shown, which define two connected regions of a sputtering zone 20 and form magnetic tunnel 38 shown in FIG. 1.

Spacers of electrically nonconductive material are provided between the pole shoes, i.e., spacer 21 between shoes 3, 4 and spacer 22 between shoes 4, 5. As a result, a cylindrical block is formed overall by pole shoes 3, 4, 5 and spacers 21, 22, this block being is enclosed by cylindrical target 2 with a small amount of clearance. It is possible to provide cooling channels 23, 24, through which a coolant, usually water, can flow to carry away the process heat, either in spacers 21, 22 or in pole shoes 3, 4, 5, or in both sets of these components.

Figure 2:
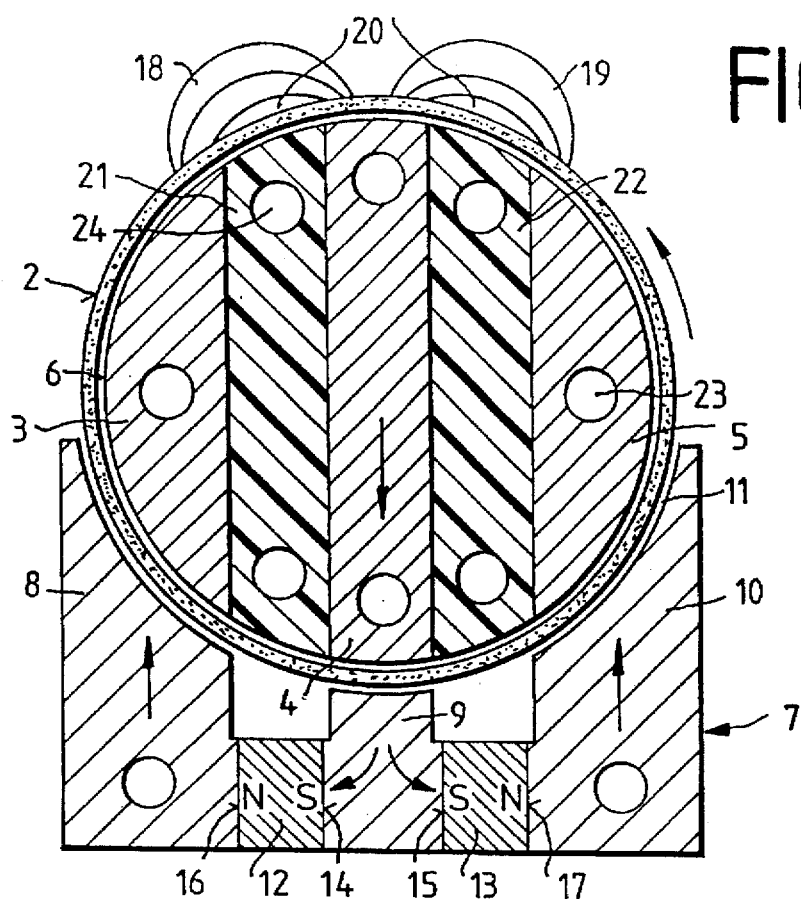
FIG. 2 is a cross section.
Figure 3:
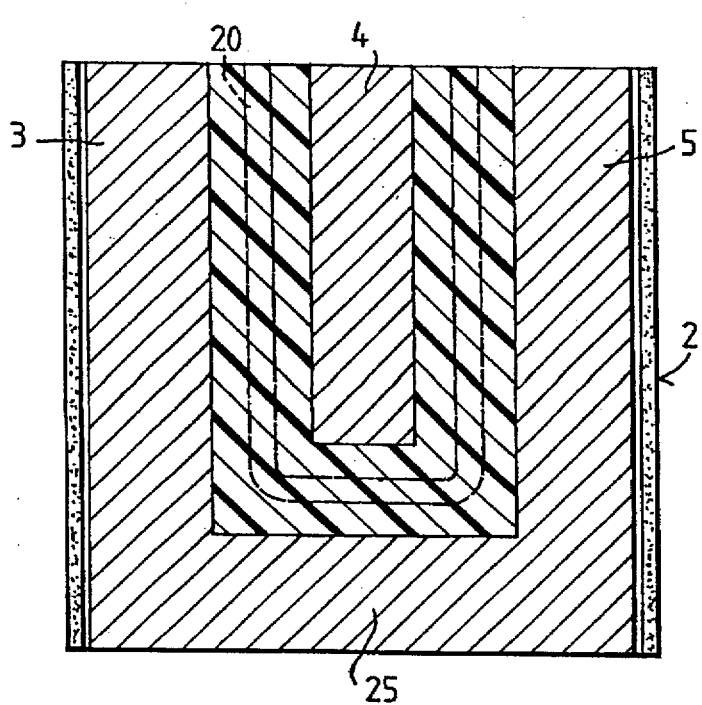
FIG. 3 is a horizontal cross section through an end region of the target-supporting hollow body.

The horizontal cross section according to FIG. 3 through an area at the end of target 2 shows that pole shoes 3, 4, 5 are connected at their ends by a yoke 25. As a result, sputtering zone 20, which forms the erosion pit, has the form of a rectangle on target 2. A U-shaped area of this pit is shown in FIG. 2.

Figure 4:
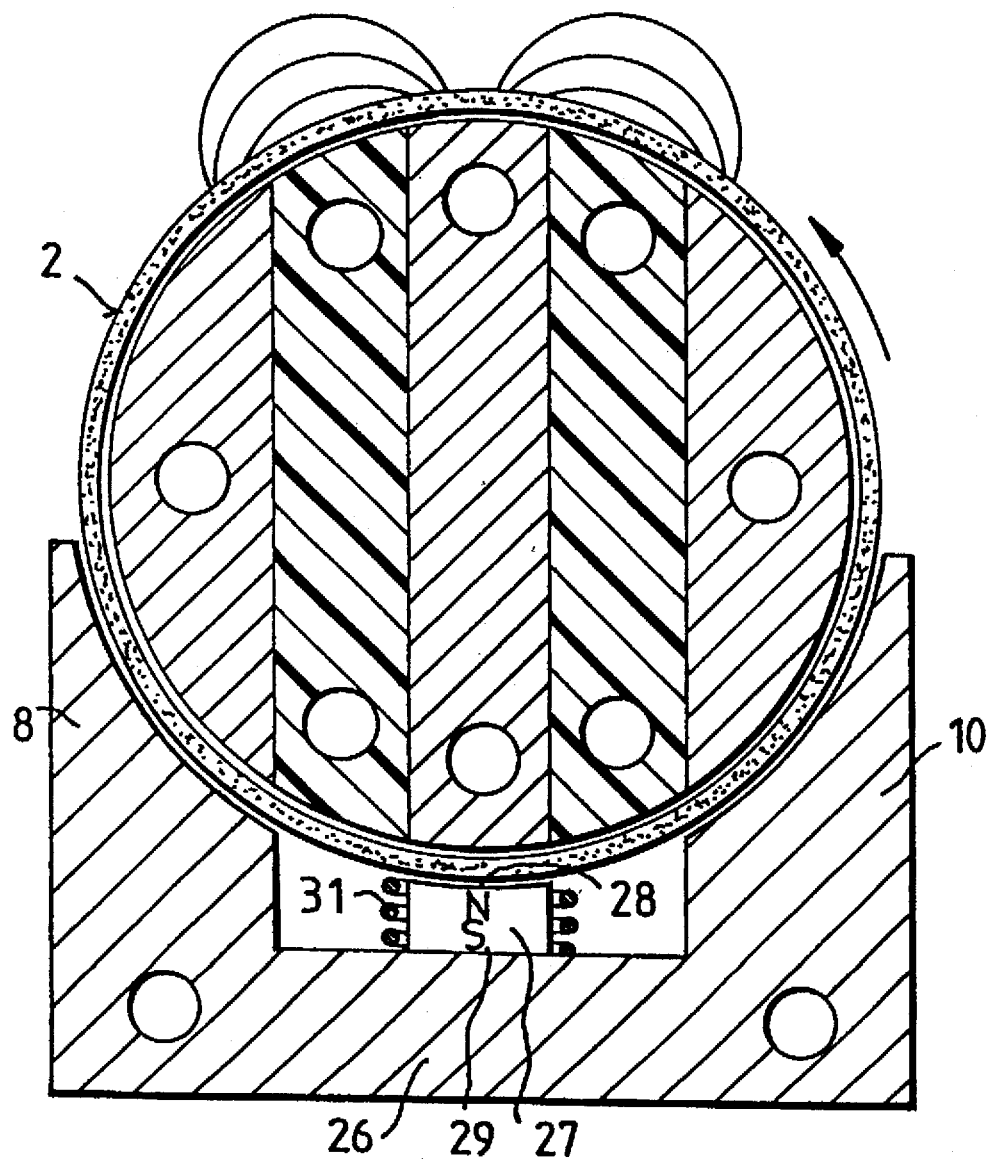
FIG. 4 is a cross section through a second embodiment.

In the embodiment according to FIG. 4, pole shoes 8, 9 are connected to each other by a shank 26 to form a U-shaped, one-piece component. Instead of the design shown in FIG. 1 with a central pole shoe 9, a magnet 27 is provided, which sits on shank 26 and extends up to a point just in front of target 2. This magnet 27 has one pole 28 facing target 2 while the other pole 29 faces shank 26. Magnet 27 can be a permanent magnet or an electromagnet, just as in the case of magnets 12, 13 of the preceding exemplary embodiments. For illustration, a coil 31 is shown in FIG. 4.

The apparatus shown in FIG. 5 has two identical hollow bodies, each one forming a target 2, 2a wherein the two targets 2, 2a can be connected in a alternation to voltages of opposite polarity. Magnetic flux guide element 7 is bilaterally symmetric to a line 30, so that targets 2, 2a can be located a short distance away from the ends of pole shoes 8, 9, 10. In the area of line 30, pole shoes 8, 9, 10 are connected to each other by magnets 12, 13 as in the case of the embodiment according to FIGS. 1 and 2. The magnetization is also the same as that described in conjunction with FIGS. 1 and 2.

We claim:

1. Apparatus for coating a substrate (37) by sputtering the surface of a first tubular target which can be rotated around longitudinal axis (R), the sputtering being accomplished by means of electrical energy, where the first target (2) is provided with magnets (12, 13, 32, 33) to produce a sputtering zone (20) extending in the longitudinal direction of the target (2) and where a pair of magnets (12, 13) are associated with pole shoes (3, 4, 5) of magnetically conductive material inside the target (2) so that the magnetic field can be guided from the magnets (12, 13) to the sputtering zone (20) of the target (2), characterized in that the magnets (12, 13) are set up outside the target (2), and in that the magnetic field is transmitted through the target (2) to the pole shoes (3, 4, 5) inside the target (2) across gaps (6, 11).

2. Apparatus according to claim 1 wherein a magnetic flux guide element (7) is provided on one side of the first target (2), in alignment with the pole shoes (3, 4, 5) inside the target (2), this guide element being connected to the magnets (12, 13).

3. Apparatus according to claim 2 wherein the magnetic flux guide element (7) has three parallel pole shoes (8, 9, 10) directed toward the lateral surface of the target (2), and one of said magnets (12, 13) is provided on each side of the center pole shoe (9), the magnets resting by the same pole (14, 15) against the center pole shoe (9) and by their opposite pole (16, 17) against the other pole shoes (8, 10).

4. Apparatus as in claim 1 wherein at least one of magnets (12, 13) are permanent magnets.

5. Apparatus as in claim 1 wherein at least one of magnets (12, 13) are electromagnets.

6. Apparatus as in claim 1 wherein the pole shoes (3, 4, 5) inside the target (2) are connected to each other by two spacers (21, 22) of magnetically nonconductive but thermally conductive material.

7. Apparatus as in claim 6 further comprising cooling channels (23, 24), through which a coolant can pass to carry away the heat of the target (2), provided in at least one of the pole shoes (3, 4, 5) and the spacers (21, 22).

8. Apparatus as in claim 2 wherein the magnetic flux guide element (7) has three parallel pole shoes (8, 9, 10), which are connected to each other by magnets (12, 13); and a second target (2a), which is designed as a hollow body with pole shoes (3, 4, 5) in alignment with the pole shoes (8, 9, 10) of the magnetic flux guide element (7), is provided the one opposite side of the pole shoes (8, 9, 10) from the first target (2).

9. Apparatus according to claim 8 wherein the two targets (2, 2a) can be connected in alternation to voltages of opposite polarity.

10. Apparatus according to claim 1 further comprising transverse magnets (32, 33) and transverse pole shoes (35, 36) extending transversely to the longitudinal axis (R) of the target, said magnets (12, 13) together with said transverse magnets (32, 33) forming a magnetic frame (34), which is enclosed by the pole shoes (8, 10) and by the transverse pole shoes (35, 36), which connect the shoes (8, 10) to each other at their end surfaces, said magnetic frame (34) forming a closed magnetic tunnel over said target.

11. Apparatus as in claim 3 wherein each surface of the pole shoes (8, 9, 10) facing the first tubular target (2) conforms to the shape of the first tubular target (2).

12. Apparatus as in claim 1 wherein the lateral surfaces of the inner pole shoes (3, 4, 5) facing the inside wall of the first tubular target (2) are designed as the lateral surfaces of a cylinder.

13. Apparatus as in claim 10 wherein at least one end surface of each of the pole shoes (35, 36) extending transversely to the longitudinal axis (R) of the target is fixed to the wall of a coating chamber; and each of the pole shoes (8, 9, 10) extending parallel to the rotational axis (R) of the target is fixed to a transverse pole shoe (35, 36).

14. Apparatus for coating a substrate by sputtering, said apparatus comprising a first tubular target rotatable about a central axis R, said target having a tubular inside surface and a tubular outside surface, a plurality of inner pole shoes extending parallel to said axis inside said target and separated from said inside surface by an inner gap, magnet means extending parallel to said axis outside said target, and a plurality of outer pole shoes extending parallel to said axis outside said target and separated from said outside surface by an outer gap, said outer pole shoes being arranged to transmit flux from said magnet means across said outer and inner gaps to said inner pole shoes, thereby creating a longitudinal sputtering zone parallel to said axis and outside said target opposite from said outer pole shoes.

15. Apparatus as in claim 14 further comprising a center shank connecting two of said outer pole shoes, said magnet means comprising a magnet on said shank between said two outer pole shoes, said magnet having one pole facing said target and an opposite pole facing said shank.

16. Apparatus as in claim 14 wherein said magnet means is an electromagnet.

* * * * *

UNITED STATES PATENT AND TRADEMARK OFFICE
CERTIFICATE OF CORRECTION

PATENT NO. : 5,688,388
DATED : Nov. 18, 1997
INVENTOR(S) : Bähr et al.

It is certified that error appears in the above-identified patent and that said Letters Patent is hereby corrected as shown below:

column 1, line 56, before "subsurface" delete -- -- --.
column 6, line 24, before "alternation" delete -- a --.
Claim 1, column 6, line 36, before "longitudinal" insert -- a --.

Signed and Sealed this

Twenty-second Day of August, 2000

Attest:

Attesting Officer

Q. TODD DICKINSON

Director of Patents and Trademarks